US012711296B2

(12) United States Patent
K M et al.

(10) Patent No.: US 12,711,296 B2
(45) Date of Patent: Aug. 18, 2026

(54) SCAN CHAIN OPTIMIZATION UTILIZING CONSTRAINED SINGLE LINKAGE CLUSTERING

(71) Applicant: INTERNATIONAL BUSINESS MACHINES CORPORATION, Armonk, NY (US)

(72) Inventors: Gireesh Kumar K M, Bangalore (IN); Nawaz Sharief Mohammad, Bangalore (IN); George Antony, Cochin (IN); Naiju Karim Abdul, Bangalore (IN); Rahul M Rao, Bangalore (IN)

(73) Assignee: International Business Machines Corporation, Armonk, NY (US)

(*) Notice: Subject to any disclaimer, the term of this patent is extended or adjusted under 35 U.S.C. 154(b) by 161 days.

(21) Appl. No.: 18/192,558

(22) Filed: Mar. 29, 2023

(65) Prior Publication Data

US 2024/0330554 A1 Oct. 3, 2024

(51) Int. Cl.
*G06F 30/333* (2020.01)
*G06F 30/3323* (2020.01)

(52) U.S. Cl.
CPC ........ *G06F 30/333* (2020.01); *G06F 30/3323* (2020.01)

(58) Field of Classification Search
CPC ... G06F 30/333; G06F 30/3323; G06F 30/398
See application file for complete search history.

(56) References Cited

U.S. PATENT DOCUMENTS

| | | | | |
|---|---|---|---|---|
| 7,430,699 | B2 * | 9/2008 | Fredrickson | G06F 30/30 716/122 |
| 8,196,074 | B2 | 6/2012 | Fredrickson et al. | |
| 9,529,046 | B2 * | 12/2016 | Douskey | G01R 31/318583 |
| 10,289,795 | B1 * | 5/2019 | Gao | G06F 30/394 |
| 11,055,461 | B1 | 7/2021 | Beck et al. | |
| 11,113,444 | B2 | 9/2021 | Goel et al. | |
| 11,847,398 | B2 * | 12/2023 | Lian | G06F 30/392 |
| 2020/0004913 | A1 | 1/2020 | Goel et al. | |
| 2022/0100936 | A1 | 3/2022 | Abdul et al. | |

OTHER PUBLICATIONS

Abdul et al., Scan Chain Clustering and Optimization with Constrained Clustering and Reinforcement Learning, MLCAD '22: Proceedings of the 2022 ACM/IEEE Workshop on Machine Learning for CAD, URL: https://doi.org/10.1145/3551901.3556493, dated Sep. 2022, 7 pages.

(Continued)

*Primary Examiner* — Jack Chiang
*Assistant Examiner* — Brandon Bowers
(74) *Attorney, Agent, or Firm* — Stosch Sabo

(57) ABSTRACT

Scan chain optimization utilizing constrained single linkage clustering is disclosed. In an embodiment, a physical design tool identifies a placement of a plurality of latches in a circuit layout; generates, based on the placement, a set of latch clusters by applying constrained single-linkage agglomerative clustering to the plurality of latches; optimizes the set of latch clusters by redistributing latches across clusters; and generates a set of scan chains corresponding to the optimized set of latch clusters.

20 Claims, 13 Drawing Sheets

(56) References Cited

OTHER PUBLICATIONS

Anonymous, Constrained Clustering-Based SCAN Chain Creation for Wirelength Optimization, an IP.com Prior Art Database Technical Disclosure, IP.com No. IPCOM000268107D, IP.com Electronic Publication Date: Dec. 27, 2021, 5 pages.

Anonymous, Method to optimize scan chains in a flattened VLSI design across multiple logical hierarchies, An IP.com Prior Art Database Technical Disclosure, IP.com No. IPCOM000226570D, IP.com Electronic Publication Date: Apr. 16, 2013, 8 pages.

Davidson et al., Agglomerative Hierarchical Clustering with Constraints: Theoretical and Empirical Results, ECMLPKDD'05: Proceedings of the 9th European Conference on Machine Learning and Principles and Practice of Knowledge Discovery in Databases, published Oct. 3, 2005, 12 pages.

* cited by examiner

SCAN CHAIN OPTIMIZATION UTILIZING CONSTRAINED SINGLE LINKAGE CLUSTERING

BACKGROUND

Field of the Disclosure

The field of the disclosure is design-for-test systems, or, more specifically, methods, apparatus, and products for scan chain optimization utilizing constrained single linkage clustering.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

A design-for-test (DFT) system within a circuit includes scan latches that provide observability and controllability as to the state of the circuit that is not possible through functional inputs and outputs. Often, scan latches are connected together as a scan chain that forms a shift register through which a test pattern is applied. Scan chains are connected to primary inputs and primary outputs, which are called scan inputs and scan outputs respectively. By serially shifting arbitrary values into the scan chain from scan inputs (i.e., scan in), all the scan latches can be set to desired states. Similarly, the scan latches can be observed by scanning out their values in the scan chain through the scan outputs.

SUMMARY

Methods, apparatuses, and computer program products for scan chain optimization utilizing constrained single linkage clustering according to various embodiments are disclosed. In a particular embodiment, a method for scan chain optimization utilizing constrained single linkage clustering includes identifying, by a physical design tool, a placement of a plurality of latches in a circuit layout. The method also includes generating, by the physical design tool based on the placement, a set of latch clusters by applying constrained single-linkage agglomerative clustering to the plurality of latches. The method also includes optimizing, by the physical design tool, the set of latch clusters by redistributing latches across clusters. The method further includes generating, by the physical design tool, a set of scan chains corresponding to the optimized set of latch clusters.

The foregoing and other objects, features and advantages of the disclosure will be apparent from the following more particular descriptions of exemplary embodiments of the disclosure as illustrated in the accompanying drawings wherein like reference numbers generally represent like parts of exemplary embodiments of the disclosure.

DETAILED DESCRIPTION

Circuit testing using Design-for-Test scan latches is a multi-step process that involves shifting the test patterns into scan latches, applying the shifted test patterns to the circuit, and shifting test responses out of the circuit. The time it takes to complete this process is the DFT test time. To reduce DFT test time, scan latches are divided into multiple scan chains which are driven simultaneously. Thus, the target DFT test time, or scan time, drives the number of latches that can be included in a scan chain. Given a maximum number of scan latches M based on the scan time and a total number of latches P in a given circuit layout, the number of scan chains N is expressed as ceiling (PIM).

When a circuit layout is synthesized from a hardware description language (e.g., VHDL, Verilog, etc.), scan latches may be distributed among multiple scan chains and assigned to scan chains in random order. During scan chain optimization, a physical design tool reconnects scan latches to form more optimal scan chains to minimize wire length of the scan chains. In one example technique, a physical design tool uses k-means clustering to create scan chains from scan latches based on their positions relative to a centroid. The number of latches in a scan chain is limited by DFT test time and each scan latch is limited to one scan chain. However, k-means clustering does not optimize the total wire length (i.e., total length of conductive traces) for connecting the scan latches of the scan chain. In addition to increasing the complexity of the signal routing for a circuit, increased wire length can also increase power consumed by the circuit.

Embodiments in accordance with the present disclosure obtain an efficient clustering of P latches into N scan chains through constrained single-linkage clustering by enforcing a set of constraints such that the total scan chain wire length across all N scan chains is minimized.

Figure 1:
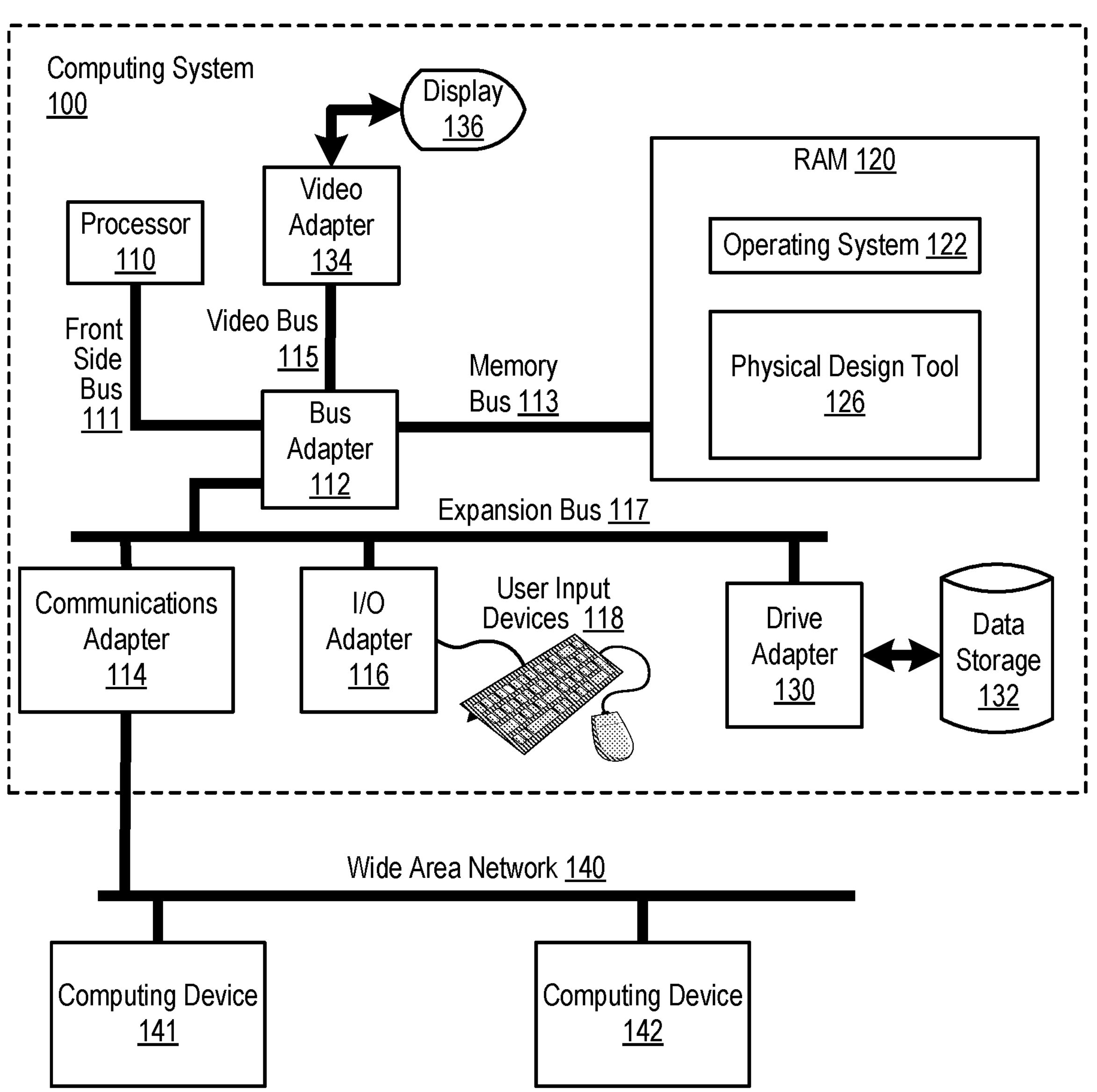
FIG. 1 a block diagram of an example computing system configured for scan chain optimization utilizing constrained single linkage clustering in accordance with embodiments of the present disclosure.

Exemplary apparatus and systems for scan chain optimization utilizing constrained single linkage clustering in accordance with the present disclosure are described with reference to the accompanying drawings, beginning with FIG. 1. FIG. 1 sets forth a block diagram of automated computing machinery comprising an exemplary computing system 100 configured for scan chain optimization utilizing constrained single linkage clustering according to embodiments of the present disclosure. The computing system 100 of FIG. 1 includes at least one computer processor 110 or 'CPU' as well as random access memory ('RAM') 120 which is connected through a high speed memory bus 113 and bus adapter 112 to processor 110 and to other components of the computing system 100.

Stored in RAM 120 is an operating system 122. Operating systems useful in computers configured for scan chain optimization utilizing constrained single linkage clustering according to embodiments of the present disclosure include UNIX™, Linux™, Microsoft Windows™, AIX™, and others as will occur to those of skill in the art. The operating system 122 in the example of FIG. 1 is shown in RAM 120, but many components of such software typically are stored in non-volatile memory also, such as, for example, on data storage 132, such as a disk drive.

Also stored in RAM 120 is a physical design tool 126 configured for scan chain optimization utilizing constrained single linkage clustering according to embodiments of the present disclosure. In some examples, the physical design tool is embodied in a set of computer program instructions that, when executed by the processor 110, cause the computing system 100 to carry out operations including identifying a placement of a plurality of latches in a circuit layout; generating, based on the placement, a set of latch clusters by applying constrained single-linkage agglomerative clustering to the plurality of latches; optimizing the set of latch clusters by redistributing latches across clusters; and generating a set of scan chains corresponding to the optimized set of latch clusters.

The computing system 100 of FIG. 1 includes disk drive adapter 130 coupled through expansion bus 117 and bus adapter 112 to processor 110 and other components of the computing system 100. Disk drive adapter 130 connects non-volatile data storage to the computing system 100 in the form of data storage 132. Disk drive adapters useful in computers configured for inserting sequence numbers into editable tables according to embodiments of the present disclosure include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system 100 of FIG. 1 includes one or more input/output ('I/O') adapters 116. I/O adapters implement user-oriented input/output through, for example, software drivers and computer hardware for controlling output to display devices such as computer display screens, as well as user input from user input devices 118 such as keyboards and mice. The example computing system 100 of FIG. 1 includes a video adapter 134, which is an example of an I/O adapter specially designed for graphic output to a display device 136 such as a display screen or computer monitor. Video adapter 134 is connected to processor 110 through a high speed video bus 115, bus adapter 112, and the front side bus 111, which is also a high speed bus.

The exemplary computing system 100 of FIG. 1 includes a communications adapter 114 for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for inserting sequence numbers into editable tables according to embodiments of the present disclosure include modems for wired dial-up communications, Ethernet (IEEE 802.3) adapters for wired data communications, and 802.11 adapters for wireless data communications. The communications adapter 114 of FIG. 1 is communicatively coupled to a wide area network 140 that also includes other computing devices, such as computing devices 141 and 142 as shown in FIG. 1.

The physical design tool 126 of FIG. 1 identifies a placement of a plurality of latches in a circuit layout. In some examples, the physical design tool 126 identifies the latches from a register transfer level (RTL) specification for the circuit layout. The latch placement specifies the physical location of the latches, for example, in the layout of a semiconductor chip.

The physical design tool 126 further generates, based on the placement, a set of latch clusters by applying constrained single-linkage agglomerative clustering to the plurality of latches. In some examples, the physical design tool generates the set of latch clusters by a) initializing the set of latch clusters; b) determining that a current cluster count is greater than a maximum scan chain count constraint; c) identifying a pair of latch clusters having a shortest cluster distance; d) determining that the shortest cluster distance is less than or equal to the maximum cluster distance constraint; e) determining whether a sum of the latch counts of the pair of clusters is less than or equal to the maximum latch count constraint; f) merging the pair of latch clusters when the maximum latch count constraint is satisfied; g) skipping the pair of latch clusters when the maximum latch count constraint is not satisfied; and repeating steps b) to g) iteratively until, for example, the number of clusters is equal to or less than the target number of scan chains for the circuit. As discussed above, the target number of scan chains is based on the number of latches in the circuit and the scan test time.

In some examples, in carrying out the clustering, the physical design tool 126 enforces a maximum latch count constraint for merging clusters. In some examples, the physical design tool 126 enforces a maximum cluster distance constraint for merging clusters. In some examples, the physical design tool 126 enforces and a must-link constraint applied to two or more latches. In various examples, the physical design tool 126 enforces combinations of the above-identified constraints. In some examples, when the circuit layout includes a macro, and physical design tool 126 applies a weight to the macro that is equal to the latch count of the macro.

The physical design tool 126 further optimizes the set of latch clusters by redistributing latches across clusters. In some examples, the physical design tool 126 optimizes the set of latch clusters by a) converting each latch cluster in the set of latch clusters to a geometric shape; b) identifying a source latch cluster, the source latch cluster having a smallest latch count among the set of latch clusters; c) identifying a destination latch cluster, wherein the destination latch cluster is a nearest latch cluster to the source latch cluster that has a latch count that is less than a maximum latch count constraint; d) determining whether a line drawn between the source latch cluster and the destination latch cluster intersects one or more intervening latch clusters; e) in response to determining that the line does not intersect an intervening latch cluster, reassigning at least one latch from the source latch cluster to the destination latch cluster; f) in response to determining that the line intersects one or more intervening latch clusters, reassigning at least one latch from the one or more intervening latch clusters to the destination latch cluster and reassigning at least one latch from the source latch cluster to the one or more intervening latch clusters; and repeating steps a) to f) iteratively until, for example, the number of clusters is equal to or less than the target number of scan chains for the circuit. In some examples, in carrying out the optimization, the physical design tool 126 also enforces one or more of the maximum latch count constraint, the maximum cluster distance constraint, and a must-link constraint.

The physical design tool 126 further generates a set of scan chains corresponding to the optimized set of latch clusters. In some examples, the physical design tool generates each scan chain for each latch cluster by routing a signal connecting all of the latches in the latch cluster in series by routing a signal connecting all of the latches in the latch cluster in series. The physical design tool 126 also connects an input port and an output port to the scan chain.

Figure 2A:
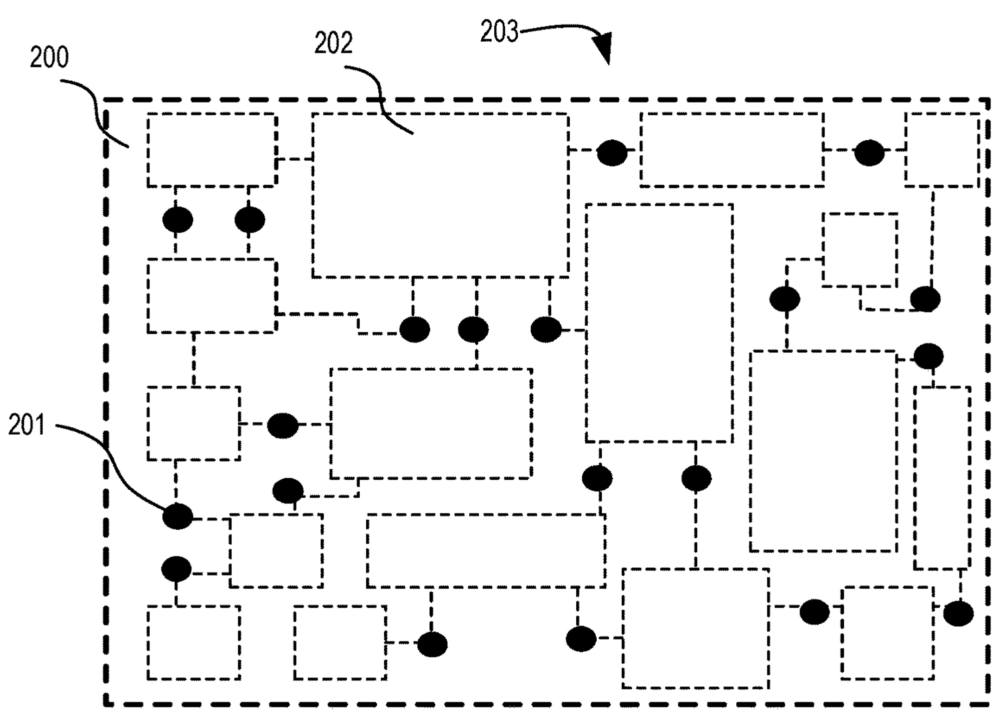
FIG. 2A shows a block diagram of an example latch placement for a circuit layout.
Figure 2B:
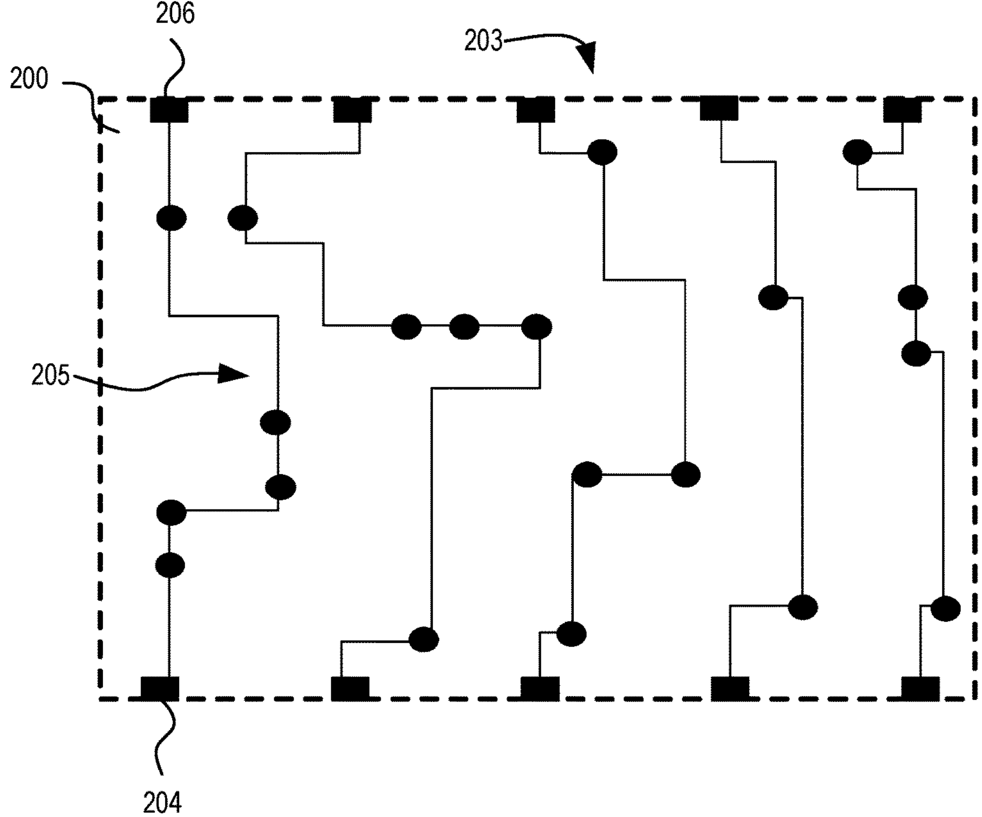
FIG. 2B shows a block diagram of an example scan chain implementation using the latch placement of FIG. 2A.

For further explanation, FIGS. 2A and 2B set forth an example latch placement 200 to aid illustration. FIG. 2A shows a plurality of scan latches 201 that are dispersed among a plurality of circuit elements 202 in a circuit layout 203. For simplicity, circuit elements 202 are illustrated as boxes. The circuit elements 202 may represent the layout of various functional logic elements, signal routing, clock trees, power distribution, etc. The circuit elements 202 may also represent hard Intellectual Property (IP) blocks or macros, where these IP's/macros may have one or more latch inside them. The latch placement 200 in the circuit layout 203 may be embodied in a register transfer level (RTL) specification or other physical design file that describes the latch placement 200. The circuit layout 203 is further simplified to illustrate a relatively small number of latches. In practice, a circuit layout may include thousands of latches. FIG. 2B shows a plurality of scan chains 205 formed by connecting scan latches 201 in series. Each scan chain 205 is connected to a scan input port 206 and a scan output port 204. In some examples, the RTL specification connects scan latches 201 into scan chains without consideration of the wire length needed to connect scan latches, or in some cases connects scan latches randomly. During physical design, scan latches 201 are reorganized into scan chains that include no more than a maximum number of latches based on the scan time or test time. In the simplified example of FIG. 2B, a maximum latch count constraint specifies that a scan chain 205 can include no more than five latches. However, in practice, a maximum latch count constraint may specify that a scan chain may include hundreds or thousands of scan latches. As explained in more detail below, the physical design tool in accordance with embodiments of the present disclosure reorganizes scan chains to reduce the total wire length connecting the scan latches in the scan chain.

Figure 3:
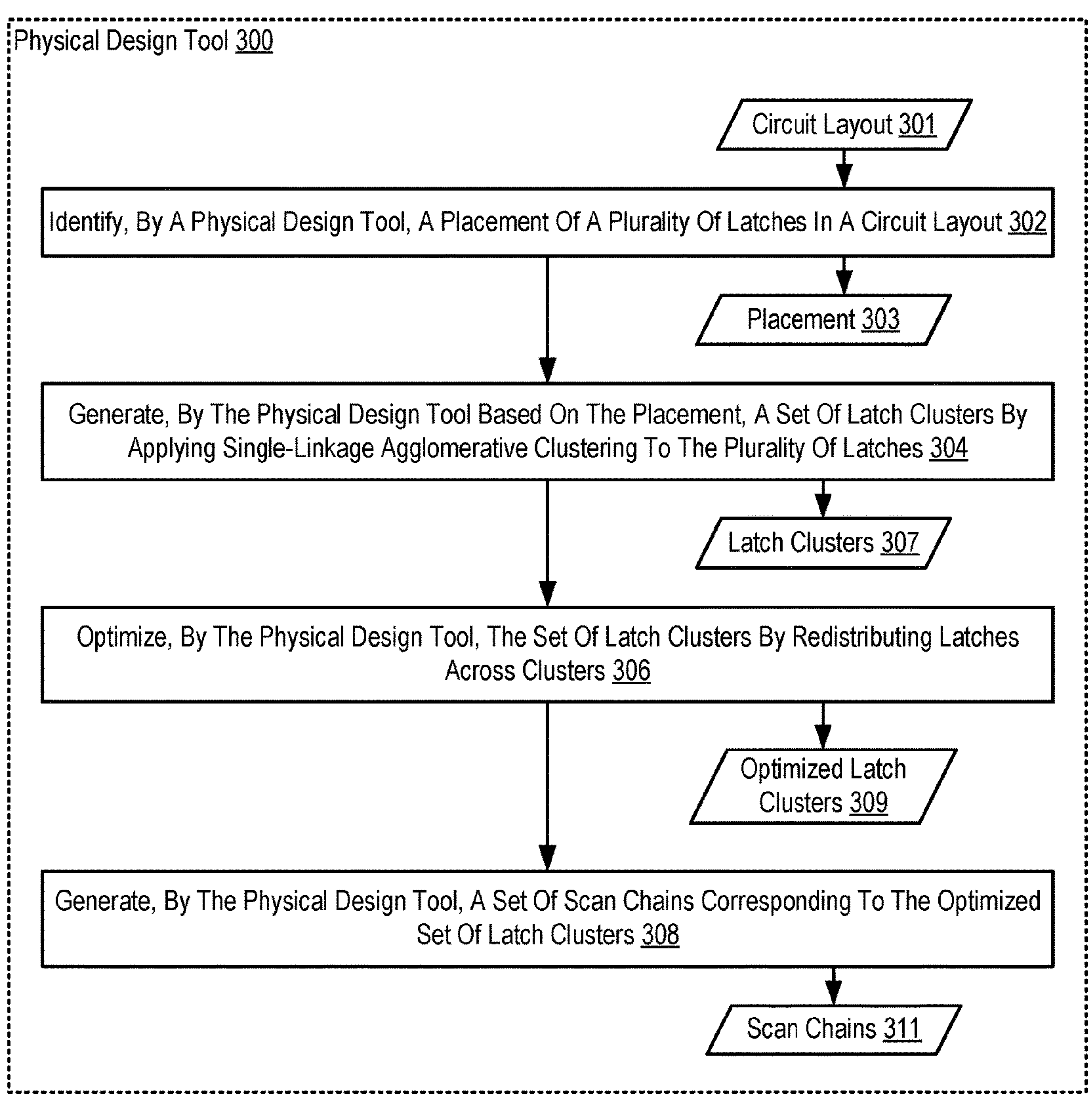
FIG. 3 is a flowchart of an example method for scan chain optimization utilizing constrained single linkage clustering according to some embodiments of the present disclosure.

For further explanation, FIG. 3 sets forth a flowchart illustrating an example method of scan chain optimization utilizing constrained single linkage clustering according to embodiments of the present disclosure. The method of FIG. 3 includes identifying 302, by a physical design tool 300, a placement 303 of a plurality of latches in a circuit layout 301. In some examples, the latches are scan latches of a DFT structure embodied in the circuit layout 301. The scan latches may be connected to form a scan chain. Inputs and outputs of a DFT scan chain may be used to test the circuit after manufacture. Although the following examples are provided in the context of scan latches for a DFT structure, conceptually the latches may be replaced other by types of circuit elements for which it is desirable to organize the circuit elements into groups and to minimize the wiring distance among the circuit elements (e.g., for implementing a clock structure).

In some examples, the physical design tool 300 (e.g., the physical design tool 126 of FIG. 1) identifies 302 a latch placement 303 in a circuit layout 301 from an RTL specification for the circuit layout 301. For example, the RTL specification may be embodied in one or more physical design files. The physical design files including the RTL specification may describe the circuit layout including the layout of functional logic as well as DFT logic, signal routing among the various logic elements, clock trees, power routing, etc. Based on the circuit layout, the locations of the latches for the DFT structure are determined by the physical design tool.

The method of FIG. 3 also includes generating 304, by the physical design tool 300 based on the placement 303, a set of latch clusters 307 by applying constrained single-linkage agglomerative clustering to the plurality of latches. In applying constrained single-linkage agglomerative clustering to the plurality of latches, the clustering is initialized by converting each individual latch into a latch cluster. Thus, each latch count may have a single member or, in other words, a latch count equal to one although some clusters may be initialized with more than one latch depending on the application of various constraints. In some examples, initializing the clustering includes applying must-link constraints. A must-link constraint requires that two or more particular latches be included in the same scan chain, and thus, the same cluster during the application of constrained single-linkage agglomerative clustering. One example of a must-link constraint is that all latches sharing a local clock buffer must be grouped together. Thus, in applying such a constraint, all latches sharing a common local clock buffer are initialized as a cluster and cannot be separated during cluster balancing. Another example of a must-link constraint is that non-reconnectable latches must be grouped together. Thus, in applying such a constraint, all latches that are non-reconnectable are initialized as a cluster and cannot be separated during cluster balancing. Yet another example of a must-link constraint is that, when a macro or hard intellectual property (IP) block includes scan latches, all of the latches that are contained the in macro or hard IP are initialized as a cluster. Thus, in applying such a constraint, all latches that are included in the macro hard IP block are initialized as a cluster and cannot be separated during cluster balancing. The latch count of the macro or hard IP block contributes to the latch count of any cluster that includes the macro or hard IP block.

After initialization of the clusters, the physical design tool 300 applies constrained single-linkage agglomerative clustering to the plurality of latches by iteratively merging clusters based on the distances between cluster pairs. For example, the physical design tool 300 may identify that, among all combinations of cluster pairs, cluster A and cluster B have the shortest distance between them. The distance between two clusters, or 'cluster distance,' is the shortest distance among all distances between any latch in a first cluster and any latch in a second cluster. The cluster distance may be expressed as $L(r,s)=\min(D(x_{ri}, x_{rj}))$ for a cluster r having a latch count of i and a cluster s having a latch count of j. Thus, cluster A and cluster B are merged to create cluster C. Cluster C may be merged with cluster D based on cluster C and cluster D having the shortest distance between them, and so on.

In some examples, the physical design tool 300 applies a maximum latch count constraint when determining whether two clusters can be merged. The maximum latch count limits the number of latches that can be included in a single cluster. Thus, if the maximum latch count is 5 (as a simplified example) and cluster A has a latch count of 3 and cluster B has a latch count of 3, cluster A and cluster B cannot be merged. In some examples, the maximum latch count constraint is based on the DFT scan length limit such that the number of latches in each cluster must be less than or equal to the DFT scan length limit. The DFT scan length limit may be based on a target test time that is indicated for a test platform.

In some examples, the physical design tool 300 applies a maximum cluster distance constraint when determining whether two clusters can be merged. The maximum cluster distance constraint limits the eligibility of two clusters for merging based on the distance between those clusters, and is therefore a cannot-merge constraint. Thus, if the cluster distance between a first cluster and a second cluster exceeds the maximum cluster distance, the first cluster and the second cluster cannot be merged. The maximum cluster distance constraint may be set by a circuit designer to limit a total wirelength needed to implement the scan chains, which may also result in the conservation of power in the circuit.

In some examples, the physical design tool 300 enforces a latch weight for each hard IP block or macro, where the latch weight is dependent upon the number of latches in the IP block or macro. For example, when a latch cluster includes a hard IP block, the number of latches in the hard IP block contribute to the latch count. Thus, when one latch cluster is merged with another latch cluster that contains the hard IP block, the number of latches in the hard IP block contributes to the determination as to whether the merged clusters would violate a latch count constraint.

In some examples, a maximum cluster count constraint may be applied to the clustering, where the maximum cluster count requires that cluster merging continues until the number of clusters is less than or equal to the maximum cluster count. For example, the circuit design may limit the number of scan chains. Thus, a limit on the number of scan chains indicates that clusters must be merged until the number of clusters is at or below the scan chain limit.

Once the physical design tool 300 applies constrained single-linkage agglomerative clustering to the plurality of latches by iteratively merging clusters based on the distances between cluster pairs, subject to any of the above constraints, the result is a set of latch clusters 307. The merging of clusters continues until no more clusters can be merged without violating a constraint or until there is only one non-empty cluster remaining. Once clustering is completed, if the number of clusters is greater than the scan chains the physical design tool 300 may optimize the clusters through a redistribution of latch assignments among the set of clusters. Even if the number of latch clusters is less than or equal to the scan chain limit, further optimization through redistribution may be advantageous. For example, the physical design tool 300 may determine that latches across multiple clusters share a common clock buffer after redistribution. In such an example, the physical design tool 300 may reassign latches among the latch clusters to reduce the sharing of a local clock buffer across two latch clusters.

The method of FIG. 3 also includes optimizing 306, by the physical design tool 300, the set of latch clusters 307 by redistributing latches across clusters. The physical design tool 300 optimizes the latch clusters 307 by balancing the clusters through the redistribution of latches from one cluster to another. Thus, latch clusters may be filled with the maximum number of latches within the latch count constraint, which may reduce the total number of clusters and thus the total number of scan chains. In moving one or more latches from membership in one cluster to membership in a different cluster, one or more of the above-described constraints is also applied. For example, the maximum latch count is also maintained for cluster balancing optimization. In some examples, the physical design tool 300 begins by identify a source cluster that is the smallest cluster among the set of clusters, and identifying a destination cluster that is the nearest cluster to the source cluster and that has at least one available spot. That is, the physical design tool 300 identifies the nearest cluster whose latch count is less than the maximum latch count, and the number of available spots in the destination cluster is the difference between the destination cluster's latch count and the maximum latch count. The number of available spots may be referred to as a latch group size in that the latch group size indicates how many latches from the source cluster may be redistributed to the destination cluster. A number of latches equal to the latch group size are redistributed from the source cluster to the destination cluster. The redistribution of latches to balance clusters is different from the merging of clusters in that, in latch redistribution, it is not a requirement that all of the latches in the source cluster move together to the destination cluster (unless there is a must-link constraint. For example, a single latch may be moved from the source cluster to the destination cluster while one or more other latches remain in the source cluster.

Consider an example where cluster A is the source cluster, being the smallest cluster among a set of clusters, and has a latch count of 2. In this example, the nearest cluster with available space is cluster B, which has a latch count of 4. Assume for this example that the maximum latch count constraint specifies a maximum latch count of 5. One latch is redistributed from membership in cluster A to membership in cluster B. Thus, one latch remains in cluster A. In a next iteration of the rebalancing optimization, cluster A may again be the smallest cluster, and the remaining latch in cluster A may or may not be redistributed to a different cluster. During clustering, cluster A could not have been merged with cluster B as this would have violated the maximum latch count.

The physical design tool 300 iteratively identifies the smallest latch cluster and redistributes latches to the nearest cluster with free space until no further redistribution can be carried out without violation of the maximum latch count constraint. In some examples, the physical design tool 300 identifies one or more intervening clusters between the source cluster and the destination cluster and redistributes latches from the intervening cluster to the destination cluster, thus reducing the latch count of the intervening cluster, and redistributes a latch from the source cluster to the intervening cluster. To aid illustration, consider a variation of the above example where cluster A is the source cluster and cluster B is the destination cluster with room for one additional latch. The physical design tool 300 may identify a cluster C that is in between cluster A and cluster B. Where cluster C has a latch count equal to the maximum latch count constraint, one latch may be redistributed from cluster C to cluster B, thus making room for a redistribution of one latch from cluster A to cluster C.

The method of FIG. 3 also includes generating 308, by the physical design tool 300, a set of scan chains 311 corresponding to the optimized set of latch clusters 309. In some examples, the physical design tool 300 generates a scan chain 311 for each latch cluster by routing a signal connecting all of the latches in the latch cluster in series. The physical design tool 300 also connects an input port and an output port to the scan chain. In some examples, the physical design tool 300 identifies an input/output port pair by selecting the input/output port pair from a set of input/output port pairs in the circuit layout and calculates a port pair distance by determining the distance of an input port to a latch cluster and the distance of the output port of the latch cluster and summing the distances. This process is repeated for each latch cluster in the set of latch clusters to arrive at a port pair distance relative to each latch cluster. The physical design tool 300 then attaches the input/output port pair to the latch cluster that has the shortest port pair distance for the input/output port pair.

Figure 4:
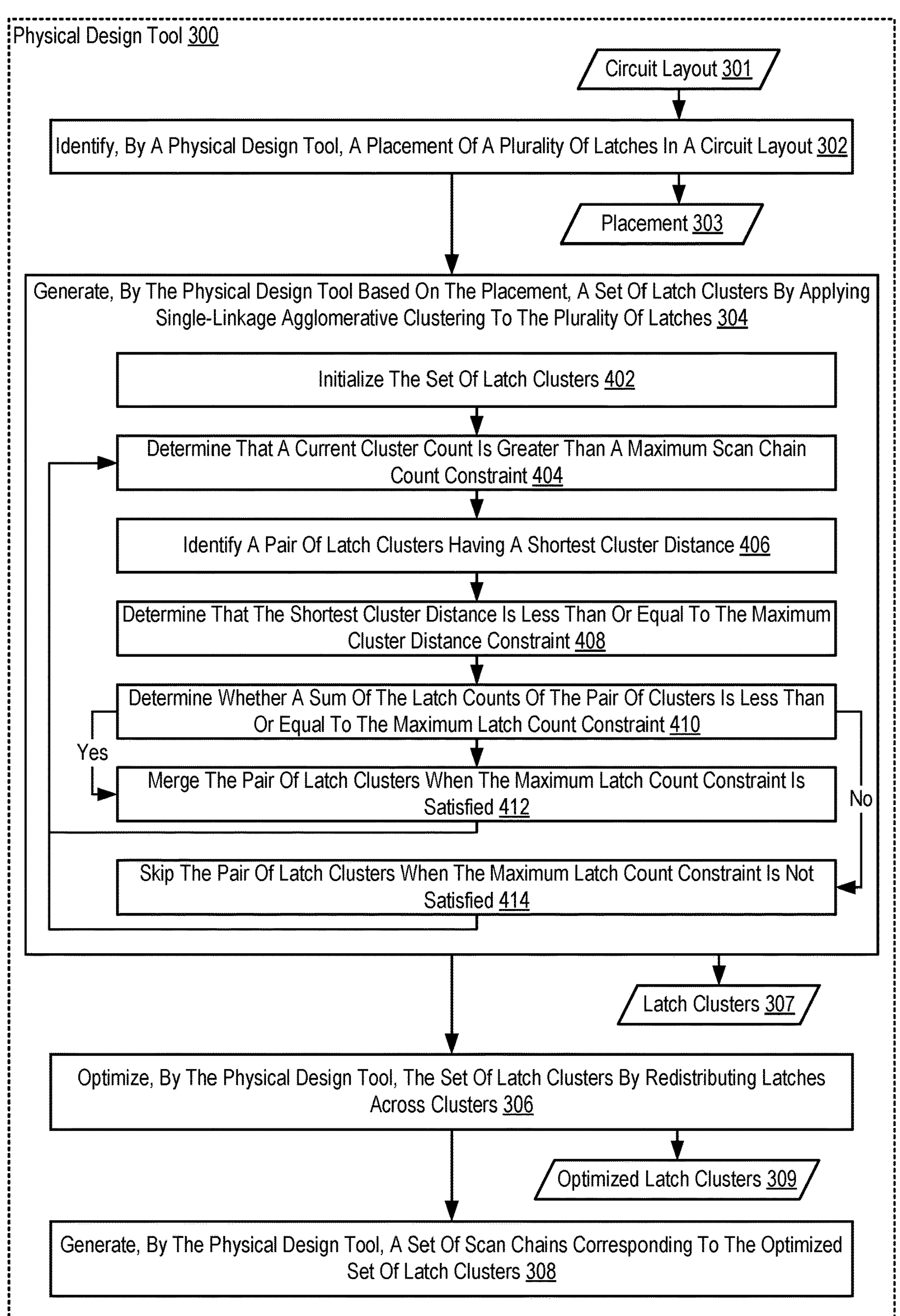
FIG. 4 is a flowchart of an example method for scan chain optimization utilizing constrained single linkage clustering according to some embodiments of the present disclosure.

For further explanation, FIG. 4 sets forth a flowchart illustrating an example method of scan chain optimization utilizing constrained single linkage clustering according to embodiments of the present disclosure. The method of FIG. 4 continues with the method of FIG. 3 by further including, as part of generating 304 a set of latch clusters 307 by applying constrained single-linkage agglomerative clustering to the plurality of latches, initializing 402 the set of latch clusters. As described above, if there is no must-link constraint, the physical design tool 300 initializes 402 the set of latch clusters by converting each individual latch to a cluster. If two or more latches are subject to a must-link constraint, the physical design tool 300 initializes 402 the set of latch clusters by creating a cluster that includes the two or more latches subject that are subject to the must-link constraint.

The method of FIG. 4 also includes, as part of generating 304 a set of latch clusters 307 by applying constrained single-linkage agglomerative clustering to the plurality of latches, determining 404 that a current cluster count is greater than a maximum scan chain count constraint. The maximum chain count constraint limits the number of scan chains that can be included in the DFT structure for the circuit. The maximum chain count constraint may be a user-defined constraint or a constraint otherwise defined by the DFT platform. As scan chains are generated from the set of latch clusters, the number of latch clusters must be less than or equal to the maximum number of scan chains. In some examples, once the number of latch clusters is less than or equal to the maximum number of scan chains, the clustering method of FIG. 4 is discontinued.

The method of FIG. 4 also includes, as part of generating 304 a set of latch clusters 307 by applying constrained single-linkage agglomerative clustering to the plurality of latches, identifying 406 a pair of latch clusters having a shortest cluster distance. In some examples, the physical design tool 300 identifying 406 a pair of latch clusters having a shortest cluster distance by determining the cluster distances among all possible pair-wise combinations of latch clusters and selecting a pair of clusters having the shortest cluster distance among all the cluster distances.

The method of FIG. 4 also includes, as part of generating 304 a set of latch clusters 307 by applying constrained single-linkage agglomerative clustering to the plurality of latches, determining 408 that the shortest cluster distance is less than or equal to the maximum cluster distance constraint. As described above, two clusters cannot be merged if their cluster distance is greater than the maximum cluster distance. The maximum cluster distance constraint may be a user-defined constraint or a constraint otherwise defined in the DFT platform to minimize total wiring length of a scan chain. Thus, in some examples, the physical design tool 300 determines 408 that the shortest cluster distance is less than or equal to the maximum cluster distance constraint by comparing the cluster distance of the pair of clusters to the maximum cluster distance. If the cluster distance of the pair of clusters, i.e., the current shortest cluster distance, is greater than the maximum cluster distance then the cluster distances of all remaining possible pair-wise combinations of clusters are also greater than the maximum cluster distance. In such a case, the clustering method of FIG. 4 is discontinued.

The method of FIG. 4 also includes, as part of generating 304 a set of latch clusters 307 by applying constrained single-linkage agglomerative clustering to the plurality of latches, determining 410 whether a sum of the latch counts of the pair of clusters is less than or equal to the maximum latch count constraint. As discussed above, the maximum latch count constraint restricts the number of latches in any cluster. The maximum latch count constraint may be based on a DFT scan length limit, and may be a user-define constraint or a constraint otherwise defined by the DFT platform. In some examples, the physical design tool 300 identifies the latch count of each cluster in the pair of clusters, adds them together, and compares the result to the maximum number of latches per cluster to determine 410 whether a sum of the latch counts of the pair of clusters is less than or equal to the maximum latch count constraint.

The method of FIG. 4 also includes, as part of generating 304 a set of latch clusters 307 by applying constrained single-linkage agglomerative clustering to the plurality of latches, merging 412 the pair of latch clusters when the maximum latch count constraint is satisfied. In some examples, the physical design tool 300 merges 412 the pair of clusters as long as combining the pair of latch clusters does not create a latch cluster that includes more latches that the maximum number of latches per cluster. After merging 412 the pair of clusters, the method of FIG. 4 is iterated by returning to step 404 above where, as long as the number of clusters is greater than the maximum number of scan chains, the pair of clusters with the next shortest distance is identified for potential merging.

The method of FIG. 4 also includes, as part of generating 304 a set of latch clusters 307 by applying constrained single-linkage agglomerative clustering to the plurality of latches, skipping 414 the pair of latch clusters when the maximum latch count constraint is not satisfied. In some examples, the physical design tool 300 determines that merging the pair of latch clusters would violate the maximum latch count constraint, and thus the pair of clusters cannot be merged. In these examples, the physical design tool 300 skips 414 the pair of latch clusters by removing them from consideration as candidates for merging, thus the pair of clusters with the next shortest distance are considered for potential merging. After skipping 414 the pair of clusters, the method of FIG. 4 is iterated by returning to step 404 above where, as long as the number of clusters is greater than the maximum number of scan chains, the pair of clusters with the next shortest distance is identified for potential merging.

Figure 5:
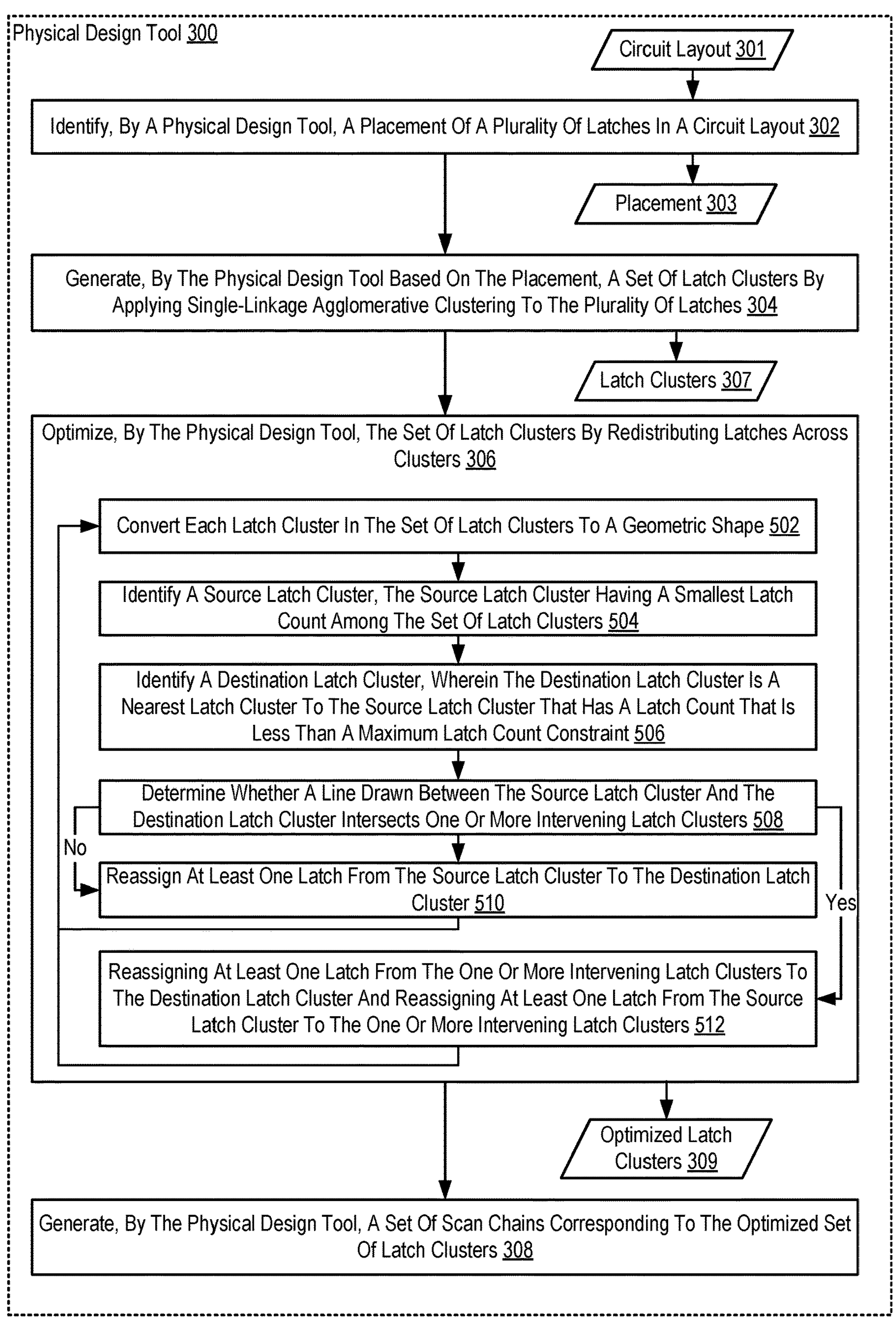
FIG. 5 is a flowchart of an example method for scan chain optimization utilizing constrained single linkage clustering according to some embodiments of the present disclosure.

For further explanation, FIG. 5 sets forth a flowchart illustrating an example method of scan chain optimization utilizing constrained single linkage clustering according to embodiments of the present disclosure. The method of FIG. 5 continues with the method of FIG. 3 by further including, as part of optimizing 306, by the physical design tool 300, the set of latch clusters 307 by redistributing latches across clusters, converting 502 each latch cluster in the set of latch clusters 307 to a geometric shape. In some examples, the physical design tool 300 converts 502 each latch cluster to a geometric shape by generating a convex hull of a set of points corresponding to the latches in the cluster, or in other words, by creating a convex polygon based on the latch cluster.

The method of FIG. 5 also includes, as part of optimizing 306 the set of latch clusters 307 by redistributing latches across clusters, identifying 504 a source latch cluster, the source latch cluster having a smallest latch count among the set of latch clusters. In some examples, the physical design tool 300 identifies the latch cluster with the least number of latches and designates that latch cluster as a source latch cluster for reassignment of latches.

The method of FIG. 5 also includes, as part of optimizing 306 the set of latch clusters 307 by redistributing latches across clusters, identifying 506 a destination latch cluster, wherein the destination latch cluster is a nearest latch cluster to the source latch cluster that has a latch count that is less than a maximum latch count constraint. In some examples, the physical design tool 300 identifies 506 the destination latch cluster by finding the nearest latch cluster and determining whether that latch cluster has room for additional latches based on the latch count being less than the maximum latch count. If the nearest latch cluster does not have room for additional latches, the next nearest latch cluster is identified, and so on.

The method of FIG. 5 also includes, as part of optimizing 306 the set of latch clusters 307 by redistributing latches across clusters, determining 508 whether a line drawn between the source latch cluster and the destination latch cluster intersects one or more intervening latch clusters. In some examples, the physical design tool 300 draws a hypothetical line (e.g., based on the cluster distance) between the source latch cluster and the destination latch cluster. In these examples, the physical design tool 300 determines 508 whether the line intersects one or more intervening latch clusters by identifying whether the line intersects the geometric shape formed by one or more other latch clusters that is not the destination latch cluster. For example, to aid illustration, cluster A may be a source cluster and cluster D may be the destination cluster, and a line drawn between them might intersect the geometric shape formed by cluster B and the geometric shape formed by cluster C. Thus, cluster B and cluster C are intervening clusters.

The method of FIG. 5 also includes, as part of optimizing 306 the set of latch clusters 307 by redistributing latches across clusters, reassigning 510 at least one latch from the source latch cluster to the destination latch cluster. In some examples, in response to determining that the line does not intersect an intervening latch cluster, the physical design tool 300 reassigns 510 one or more latches from the source cluster to the destination cluster. The number of latches reassigned depends on the latch counts of the source cluster and the destination cluster. If the latch count of the destination cluster is such that the destination cluster can accommodate all of the latches of the source cluster, then the number of latches reassigned from the source cluster is equal to the latch count of the source cluster. If the latch count of the destination cluster is such that the destination cluster cannot accommodate all of the latches of the source cluster, then the number of latches reassigned is equal to the difference between the latch count of the destination cluster and the maximum latch count constraint.

The method of FIG. 5 also includes, as part of optimizing 306 the set of latch clusters 307 by redistributing latches across clusters, reassigning 512 at least one latch from the one or more intervening latch clusters to the destination latch cluster and reassigning at least one latch from the source latch cluster to the one or more intervening latch clusters. In some examples, in response to determining that the line does intersect one or more intervening latch clusters, the physical design tool 300 determines the cluster distances between the source cluster and each intervening cluster and arranges them from nearest to farthest based on cluster distance (although there may be only one intervening latch cluster). In these examples, the physical design tool 300 reassigns 512 latches by reassigning one or more latches from the farthest intervening latch cluster to the destination latch cluster. Further, the physical design tool reassigns one or more latches from the source latch cluster to the nearest intervening latch cluster. If there are more than two intervening latch clusters, latches are similarly redistributed among them as room is created in an intervening latch cluster when latches are reassigned. The number of latches reassigned depends on the latch counts of the source cluster and the destination cluster. If the latch count of the destination cluster is such that the destination cluster can accommodate all of the latches of the source cluster, then the number of latches reassigned from the source cluster is equal to the latch count of the source cluster. If the latch count of the destination cluster is such that the destination cluster cannot accommodate all of the latches of the source cluster, then the number of latches reassigned is equal to the difference between the latch count of the destination cluster and the maximum latch count constraint.

To aid illustration, consider an example where a line between source cluster A and destination cluster E intersects intervening clusters B, C, and D in order from nearest to farthest relative to the source cluster. In this example, destination cluster has a latch count of 3 and the maximum latch count is 5. In such an example, 2 latches are reassigned from intervening cluster D to destination cluster E, 2 latches are reassigned from intervening cluster C to intervening cluster D. 2 latches are reassigned from intervening cluster B to intervening cluster C, and 2 latches are reassigned from source cluster A to intervening cluster B.

The method of FIG. 5 then finds the next smallest latch cluster by returning to identifying 504 a source latch cluster having a smallest latch count among the set of latch clusters and iteratively repeats the optimization of the latch clusters set forth in FIG. 5. In some examples, the method of FIG. 5 is discontinued once optimization of the latch clusters results in the number of latch clusters being less than or equal to the scan chain limit.

Figure 6A:
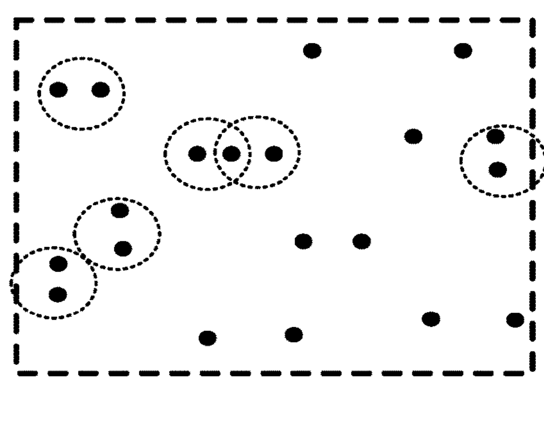
FIG. 6A is an example clustering phase in scan chain optimization utilizing constrained single linkage clustering according to some embodiments of the present disclosure.
Figure 6B:
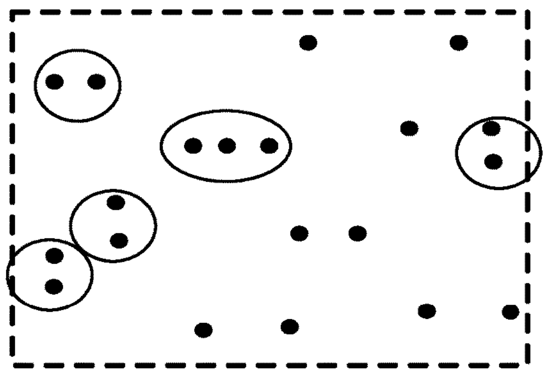
FIG. 6B is an example next clustering phase relative to FIG. 6A.

For further explanation, FIGS. 6A-6L illustrate an example clustering for scan chain optimization utilizing constrained single linkage clustering in accordance with embodiments of the present disclosure. In FIGS. 6A-6L, the example method of FIG. 5 is applied to the latch placement depicted in FIG. 2A. In FIGS. 6A-6L, the maximum latch count constraint is assumed to be 5 and the maximum cluster distance constraint is assumed to be 6 distance units. Beginning with FIG. 6A, the plurality of latches have been initialized such that each individual latch forms one cluster, and the latch cluster pair(s) with the shortest cluster distance are identified for potential merging. In FIG. 6A, pairs of latch clusters for potential merging are illustrated by dashed-line ovals. Each latch cluster pair, in this example, is separated by a cluster distance of 1 distance unit, and thus the maximum cluster distance constraint is satisfied. Further, there is no latch cluster pair that will violate the maximum latch count constraint if merged. FIG. 6B illustrates the set of latch clusters, each indicated by a solid-line oval, after the clustering in FIG. 6A.

Figure 6C:
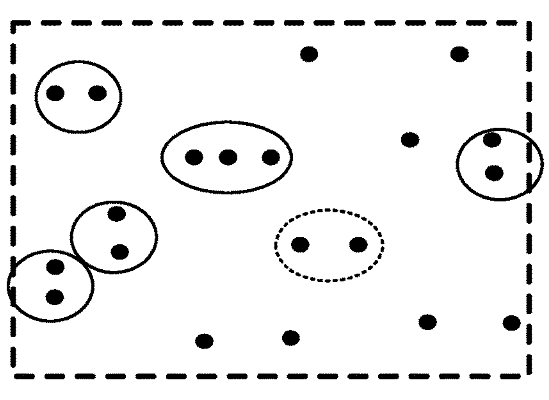
FIG. 6C is an example next clustering phase relative to FIG. 6B.
Figure 6D:
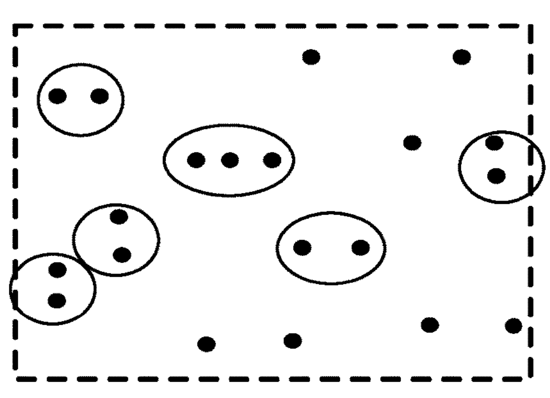
FIG. 6D is an example next clustering phase relative to FIG. 6C.

In FIG. 6C, the latch cluster pair(s) with the next shortest cluster distance are identified for potential merging. In FIG. 6C, pairs of latch clusters for potential merging are illustrated by dashed-line ovals. Each latch cluster pair, in this example, is separated by a cluster distance of 2 distance units, and thus the maximum cluster distance constraint is satisfied. Further, there is no latch cluster pair that will violate the maximum latch count constraint if merged. FIG. 6D illustrates the set of latch clusters, each indicated by a solid-line oval, after the clustering in FIG. 6C.

Figure 6E:
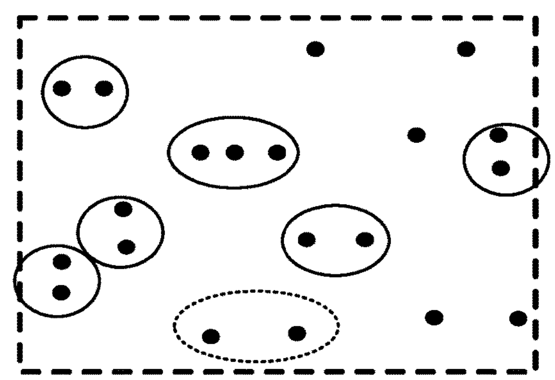
FIG. 6E is an example next clustering phase relative to FIG. 6D.
Figure 6F:
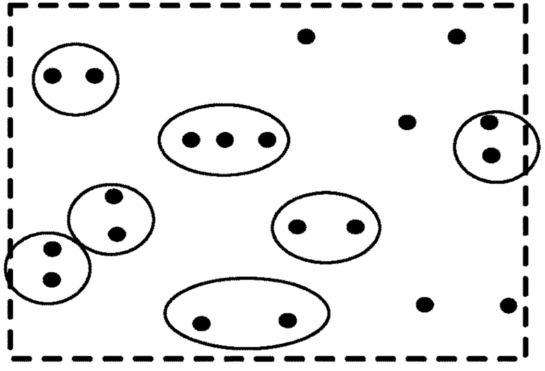
FIG. 6F is an example next clustering phase relative to FIG. 6E.

In FIG. 6E, the latch cluster pair(s) with the next shortest cluster distance are identified for potential merging. In FIG. 6E, pairs of latch clusters for potential merging are illustrated by dashed-line ovals. Each latch cluster pair, in this example, is separated by a cluster distance of 3 distance units, and thus the maximum cluster distance constraint is satisfied. Further, there is no latch cluster pair that will violate the maximum latch count constraint if merged. FIG. 6F illustrates the set of latch clusters, each indicated by a solid-line oval, after the clustering in FIG. 6E.

Figure 6G:
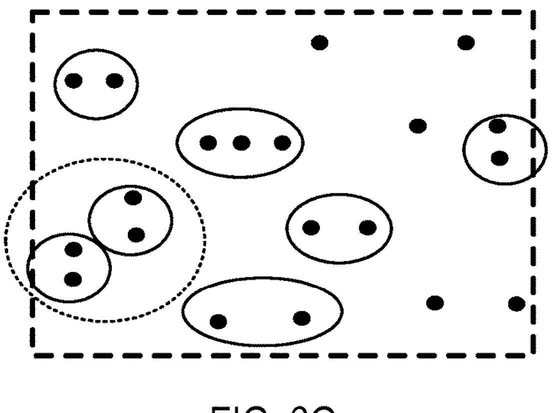
FIG. 6G is an example next clustering phase relative to FIG. 6F.
Figure 6H:
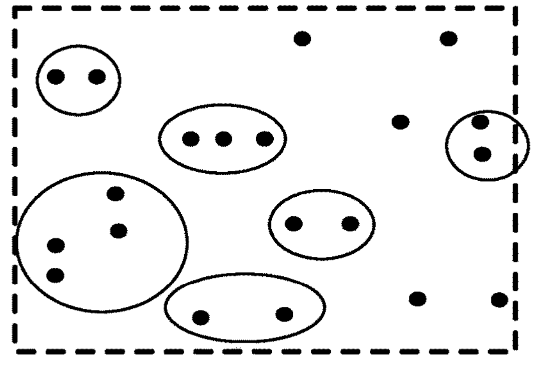
FIG. 6H is an example next clustering phase relative to FIG. 6G.

In FIG. 6G, the latch cluster pair(s) with the next shortest cluster distance are identified for potential merging. In FIG. 6G, pairs of latch clusters for potential merging are illustrated by dashed-line ovals. Each latch cluster pair, in this example, is separated by a cluster distance of 4 distance units, and thus the maximum cluster distance constraint is satisfied. Further, there is no latch cluster pair that will violate the maximum latch count constraint if merged. FIG. 6H illustrates the set of latch clusters, each indicated by a solid-line oval, after the clustering in FIG. 6G.

Figure 6I:
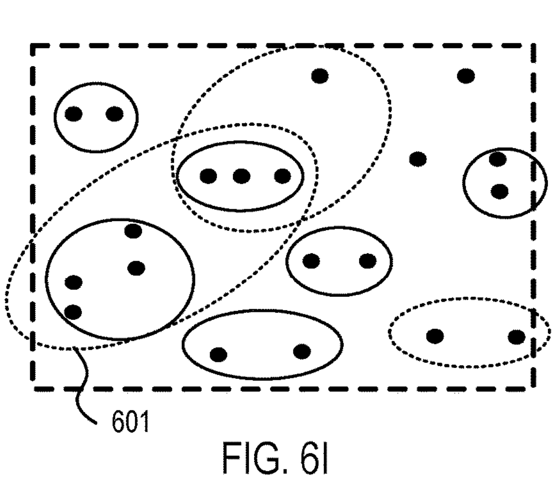
FIG. 6I is an example next clustering phase relative to FIG. 6H.
Figure 6J:
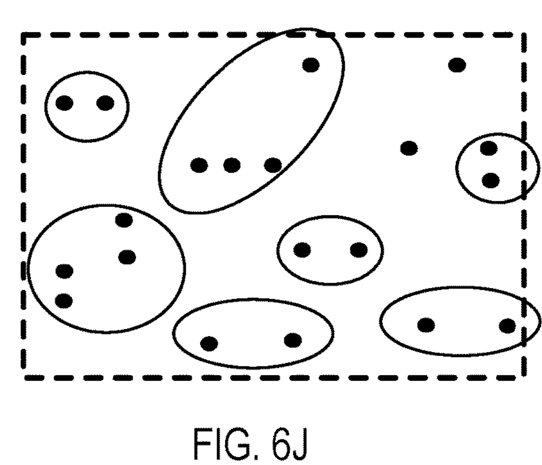
FIG. 6J is an example next clustering phase relative to FIG. 6I.

In FIG. 6I, the latch cluster pair(s) with the next shortest cluster distance are identified for potential merging. In FIG. 6I, pairs of latch clusters for potential merging are illustrated by dashed-line ovals. Each latch cluster pair, in this example, is separated by a cluster distance of 5 distance units, and thus the maximum cluster distance constraint is satisfied. However, there is one latch cluster pair 601 that will violate the maximum latch count constraint if merged. Thus, latch cluster pair 601 is skipped and removed from consideration as a potential latch pair for merging. FIG. 6J illustrates the set of latch clusters, each indicated by a solid-line oval, after the clustering in FIG. 6I.

Figure 6K:
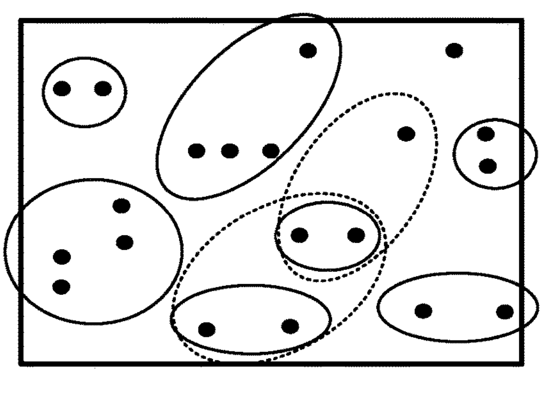
FIG. 6K is an example next clustering phase relative to FIG. 6J.
Figure 6L:
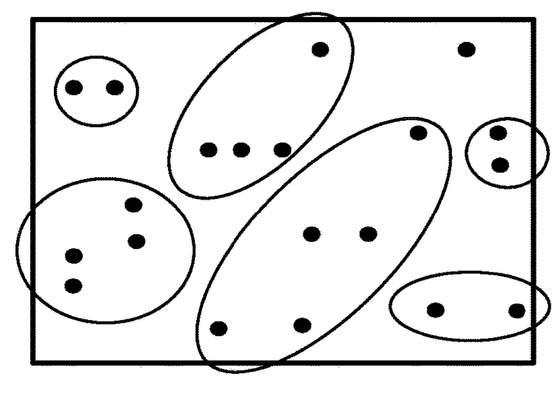
FIG. 6L is an example next clustering phase relative to FIG. 6K.

In FIG. 6K, the latch cluster pair(s) with the next shortest cluster distance are identified for potential merging. In FIG. 6K, pairs of latch clusters for potential merging are illustrated by dashed-line ovals. Each latch cluster pair, in this example, is separated by a cluster distance of 6 distance units, and thus the maximum cluster distance constraint is satisfied. Further, there is no latch cluster pair that will violate the maximum latch count constraint if merged. FIG. 6L illustrates the set of latch clusters, each indicated by a solid-line oval, after the clustering in FIG. 6K. At this point, all latch clusters in the set of latch cluster pairs are separated by a cluster distance that is greater than 6 and thus greater than the maximum cluster distance constraint. As such, the clustering ends. The set of latch clusters in FIG. 6L includes 6 latch clusters, which is greater than the target scan chain limit of 5 scan chains. Thus, the set of latch clusters is a candidate for optimization.

For further explanation, FIGS. 7A-7J illustrate an example optimization for scan chain optimization utilizing constrained single linkage clustering in accordance with embodiments of the present disclosure. In FIGS. 7A-7J, the example optimization method of FIG. 5 is applied to the set of latch clusters depicted in FIG. 6L. In FIGS. 7A-7J, the maximum latch count constraint is assumed to be 5. Beginning with FIG. 7A, the set of latch clusters from FIG. 6L have been converted to geometric shapes, including latch clusters 701, 702, 704, 705, 706, 707; whereas, latch cluster 703 includes only a single latch and thus has not been converted to a geometric shape. A latch cluster is converted to a convex hull, or the smallest polygon that encloses the latches in the latch cluster. The geometric shapes shown in FIGS. 7A-7J are for illustration only and may indicate approximations of the smallest convex polygon.

Figure 7A:
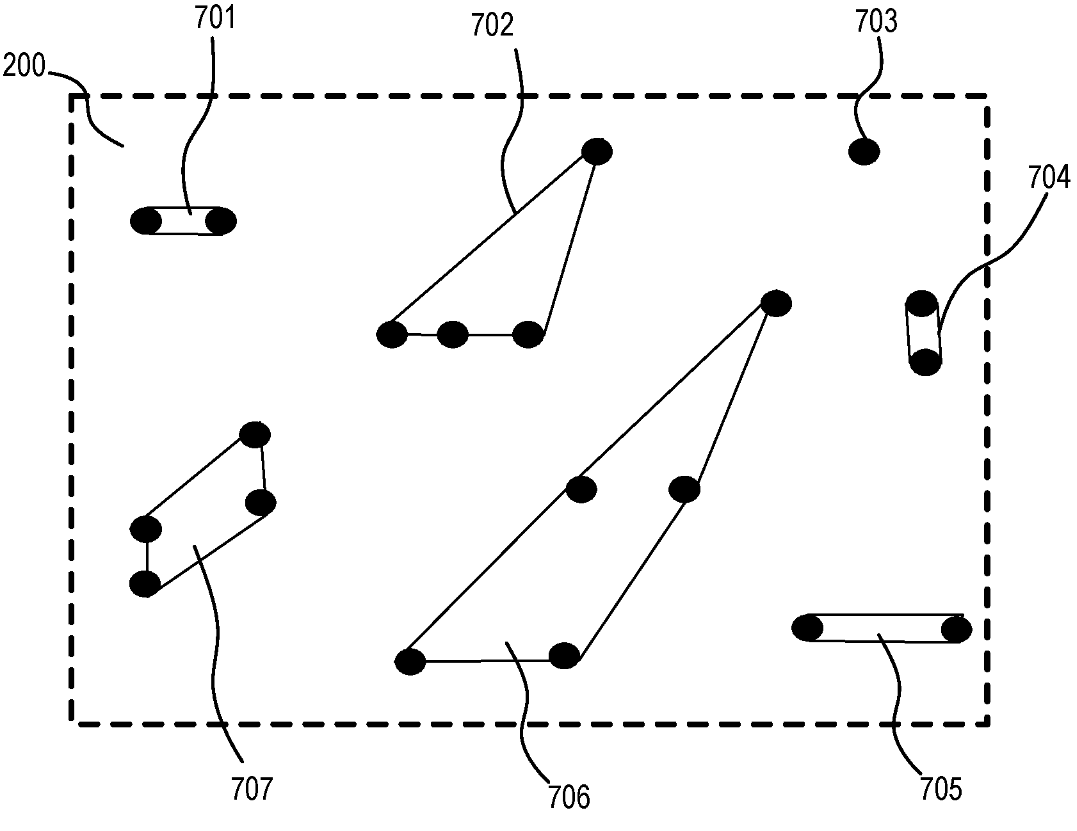
FIG. 7A is an example optimization phase in scan chain optimization utilizing constrained single linkage clustering according to some embodiments of the present disclosure.
Figure 7B:
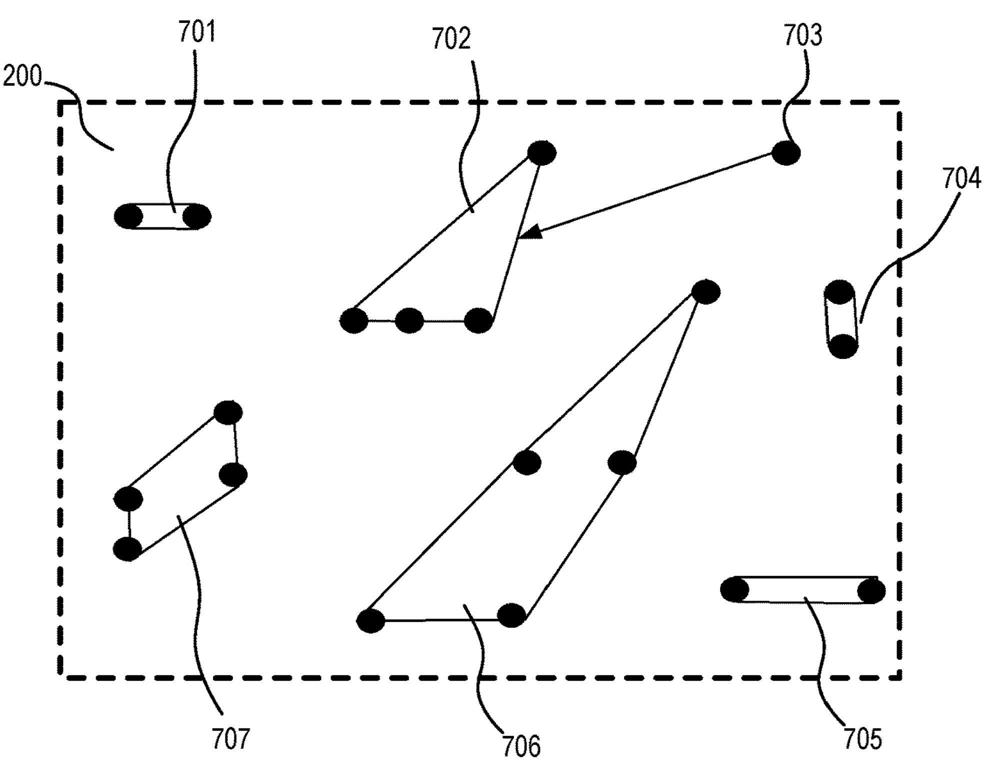
FIG. 7B is an example next optimization phase relative to FIG. 7A.
Figure 7C:
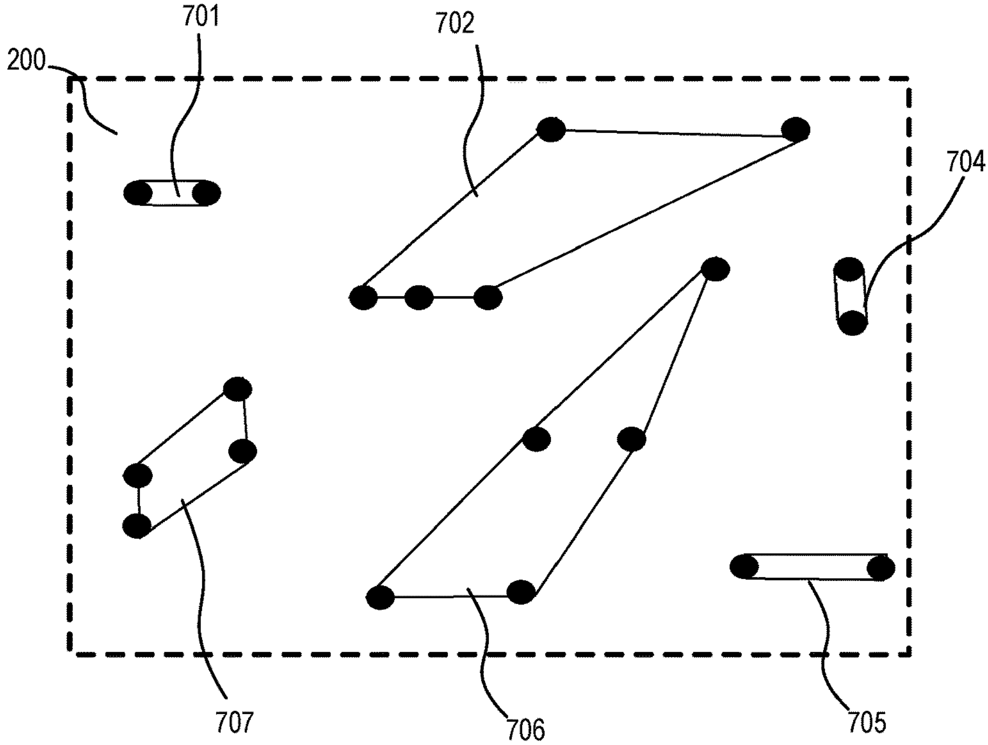
FIG. 7C is an example next optimization phase relative to FIG. 7B.

In FIG. 7B, latch cluster 703, being the smallest latch cluster, is identified as a source latch cluster. Latch cluster 702 is the nearest last cluster with available room (i.e., the latch counter is less than the maximum latch count constraint) and is thus identified as the destination latch cluster. A line drawn from latch cluster 703 to latch cluster 702 does not intersect the geometry of any other latch cluster. Thus, the single latch in latch cluster 703 is reassigned to latch cluster 702 and the now empty latch cluster 703 is deleted. FIG. 7C illustrates the optimized set of latch clusters after the reassignment, where latch cluster 702 now has a latch count of 5 and the geometric shape is updated to reflect the new latch member.

Figure 7D:
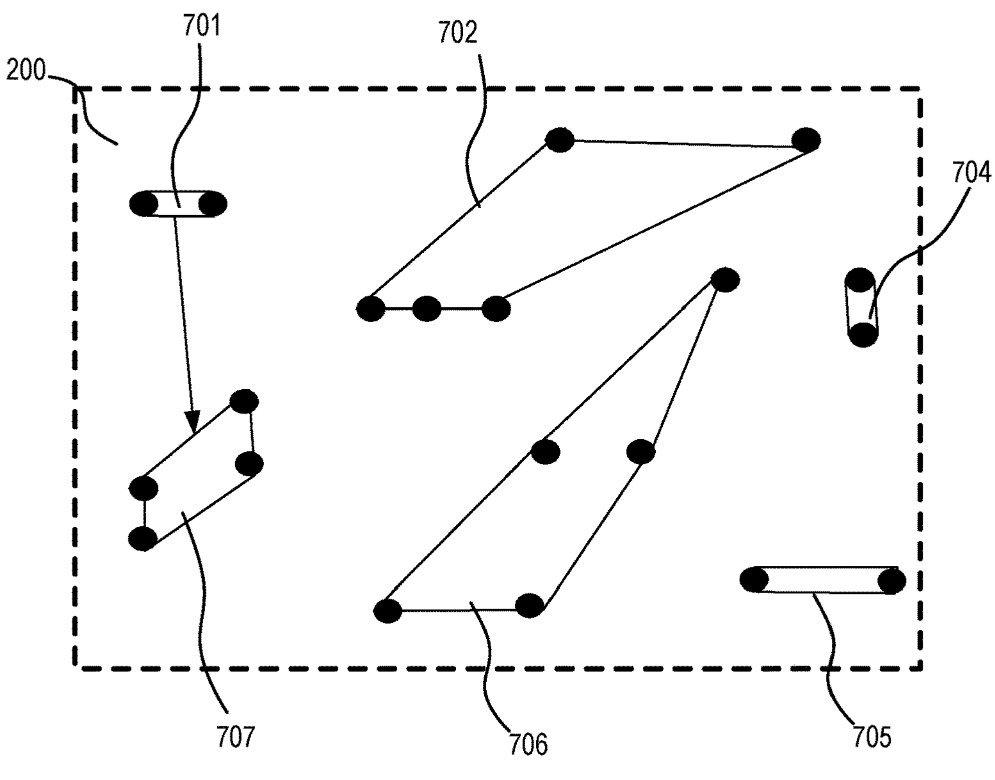
FIG. 7D is an example next optimization phase relative to FIG. 7C.
Figure 7E:
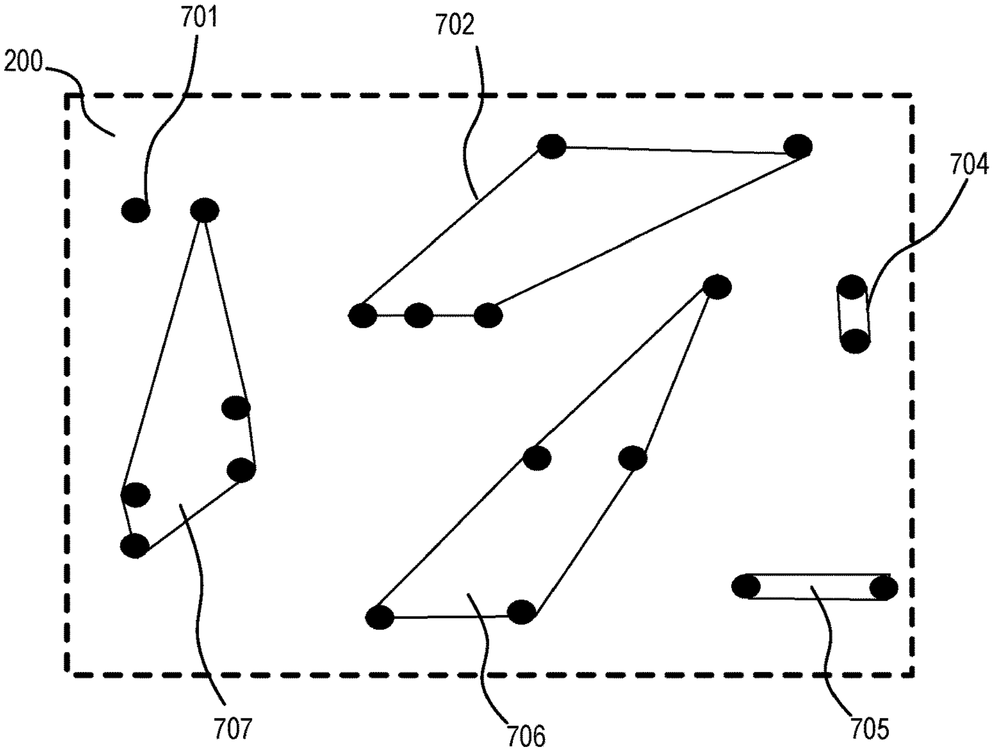
FIG. 7E is an example next optimization phase relative to FIG. 7D.

In FIG. 7D, latch cluster 701, being the smallest latch cluster, is identified as a source latch cluster. Latch cluster 707 is the nearest last cluster with available room (i.e., the latch counter is less than the maximum latch count constraint) and is thus identified as the destination latch cluster. A line drawn from latch cluster 701 to latch cluster 707 does not intersect the geometry of any other latch cluster. The latch count of the source latch cluster 701 is 2 but there is only room available for 1 latch in the destination latch cluster 707. Thus, 1 latch in latch cluster 701 is reassigned to latch cluster 707, leaving a single latch in latch cluster 701. FIG. 7E illustrates the optimized set of latch clusters after the reassignment, where latch cluster 707 now has a latch count of 5 and the geometric shape is updated to reflect the new latch member.

Figure 7F:
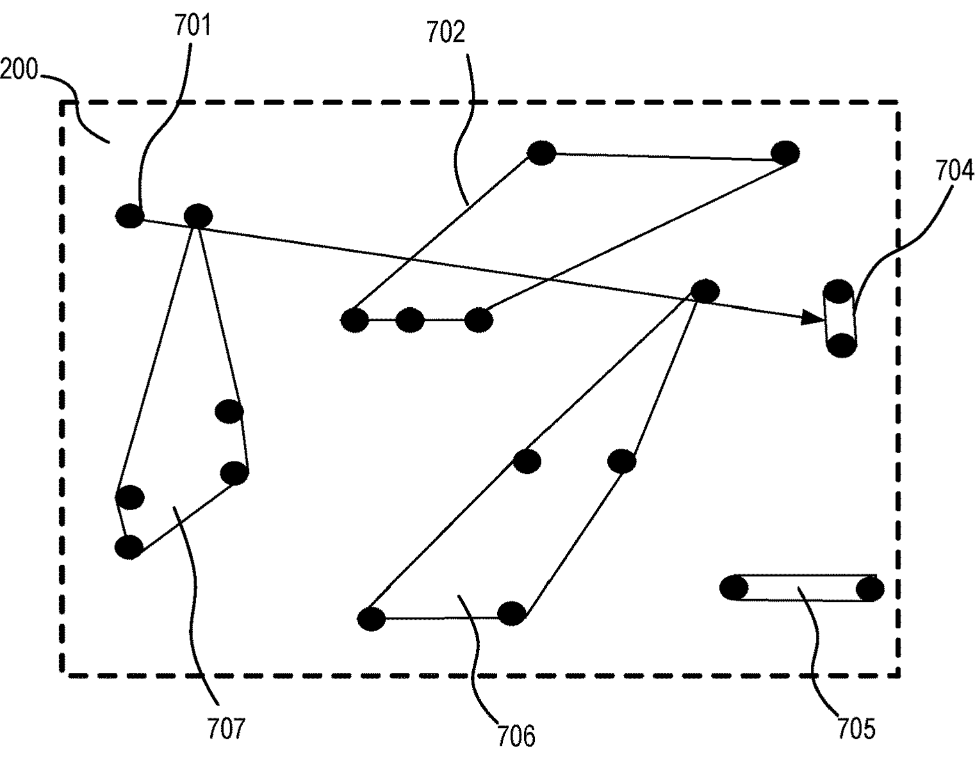
FIG. 7F is an example next optimization phase relative to FIG. 7E.
Figure 7G:
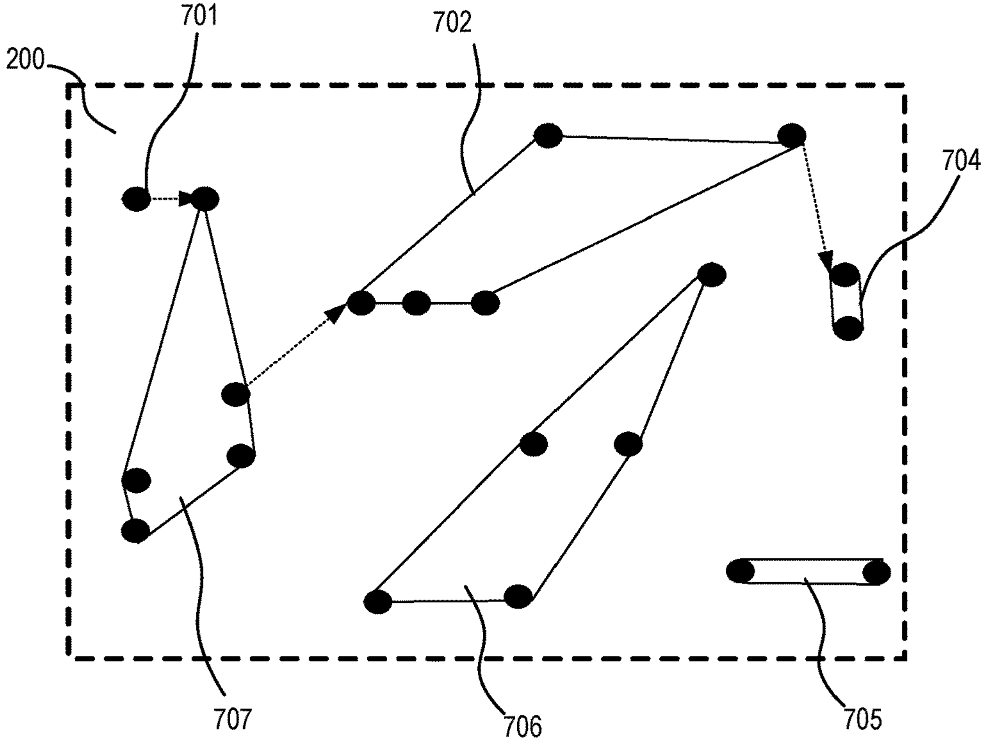
FIG. 7G is an example next optimization phase relative to FIG. 7F.
Figure 7H:
FIG. 7H is an example next optimization phase relative to FIG. 7G.
Figure 7H:
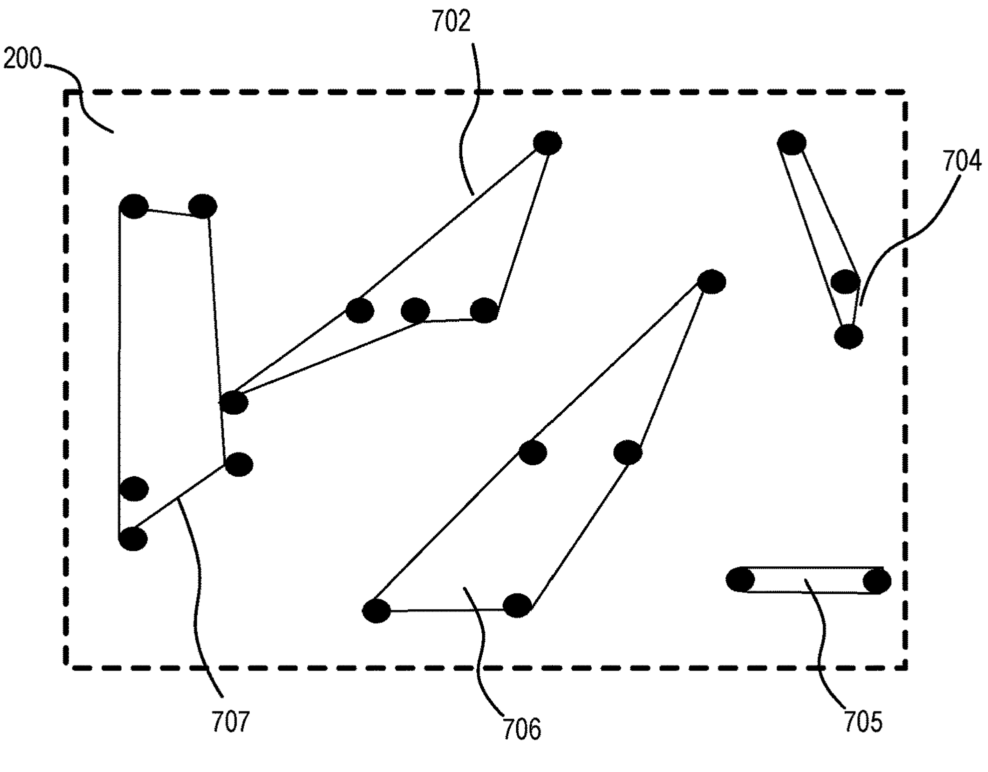

In FIG. 7F, latch cluster 701, being the smallest latch cluster, is identified as a source latch cluster with a latch count of 1. Latch cluster 704 is the nearest last cluster with available room (i.e., the latch counter is less than the maximum latch count constraint) and is thus identified as the destination latch cluster. A line drawn from source latch cluster 701 to destination latch cluster 704 intersects intervening latch clusters 707, 702, 706. As shown in FIG. 7G, a latch is reassigned from intervening latch cluster 702 to destination latch cluster 704, a latch is reassigned from intervening latch cluster 707 to intervening latch cluster 702, thus making room in latch cluster 707 for the single latch in latch cluster 701 to be reassigned to latch cluster 707. The now empty latch cluster 701 is deleted. FIG. 7H illustrates the optimized set of latch clusters after the reassignment, where the geometric shapes of the latch clusters are updated to reflect new membership.

Figure 7I:
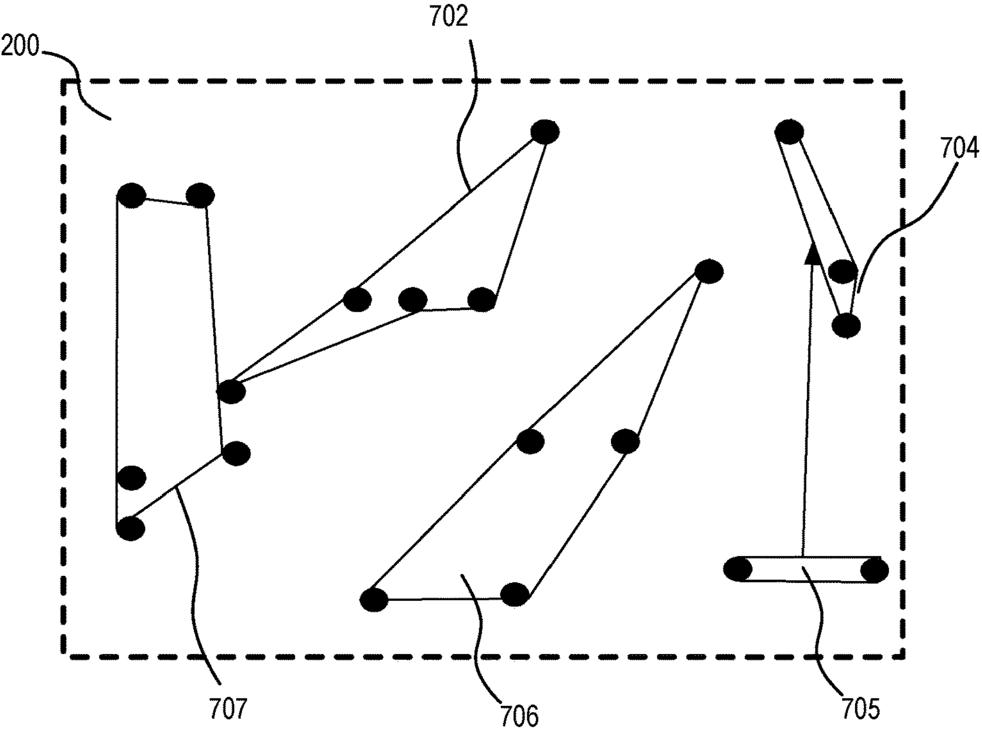
FIG. 7I is an example next optimization phase relative to FIG. 7H.
Figure 7J:
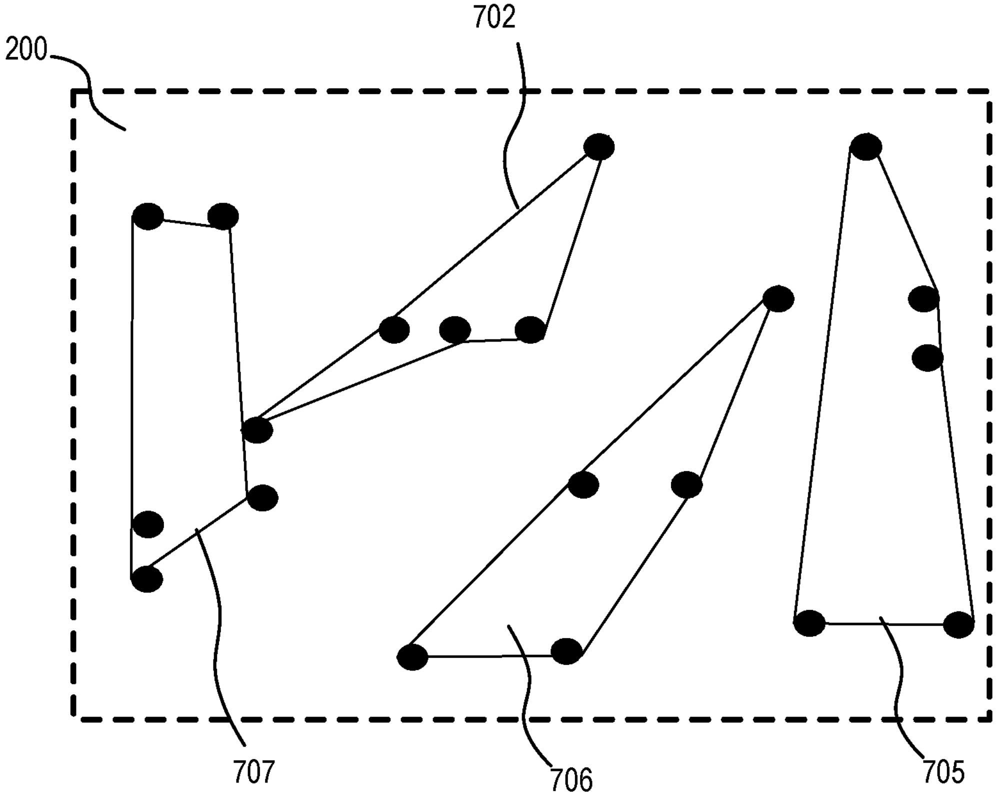
FIG. 7J is an example next optimization phase in relative to FIG. 7I.

In FIG. 7I, latch cluster 705, being the smallest latch cluster, is identified as a source latch cluster. Latch cluster 704 is the nearest last cluster with available room (i.e., the latch counter is less than the maximum latch count constraint) and is thus identified as the destination latch cluster. The latch count of the source latch cluster 705 is 2 and the space available in the destination latch cluster is 2. A line drawn from latch cluster 705 to latch cluster 704 does not intersect the geometry of any other latch cluster. Thus, both latches in latch cluster 705 are reassigned to latch cluster 704 and the now empty latch cluster 705 is deleted. FIG. 7J illustrates the optimized set of latch clusters after the reassignment, where latch cluster 704 now has a latch count of 5 and the geometric shape is updated to reflect the new latch members.

In view of the explanations set forth above, readers will recognize that the benefits of scan chain optimization utilizing constrained single linkage clustering according to embodiments of the present disclosure include:

Improved clustering of scan latches into scan chains based on physical proximity and design-for-test constraints as clustering criteria.

Reduced total wire length across all scan chains, which also improves power performance.

Exemplary embodiments of the present disclosure are described largely in the context of a fully functional computer system for optimizing network load in multicast communications. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method of scan chain optimization utilizing constrained single linkage clustering, the method comprising:

identifying, by a physical design tool, a placement of a plurality of latches in a circuit layout;

generating, by the physical design tool based on the placement, a set of latch clusters by applying constrained single-linkage agglomerative clustering to the plurality of latches;

optimizing, by the physical design tool, the set of latch clusters by redistributing latches across clusters; and generating, by the physical design tool, a set of scan chains corresponding to the optimized set of latch clusters.

2. The method of claim 1, wherein the clustering enforces a maximum latch count constraint for merging clusters.

3. The method of claim 1, wherein the clustering enforces a maximum cluster distance constraint for merging clusters.

4. The method of claim 1, wherein the clustering enforces a must-link constraint applied to two or more latches.

5. The method of claim 1, wherein the optimizing enforces one or more of: a maximum latch count constraint, a maximum cluster distance constraint, and a must-link constraint.

6. The method of claim 1, wherein the circuit layout includes a macro, and wherein the macro is weighted with a latch count of the macro.

7. The method of claim 1, wherein generating, by the physical design tool based on the placement, a set of latch clusters by applying constrained single-linkage agglomerative clustering to the plurality of latches includes:

a) initializing the set of latch clusters;

b) determining that a current cluster count is greater than a maximum scan chain count constraint;

c) identifying a pair of latch clusters having a shortest cluster distance;

d) determining that the shortest cluster distance is less than or equal to the maximum cluster distance constraint;

e) determining whether a sum of the latch counts of the pair of clusters is less than or equal to the maximum latch count constraint;

f) merging the pair of latch clusters when the maximum latch count constraint is satisfied;

g) skipping the pair of latch clusters when the maximum latch count constraint is not satisfied; and h) repeating steps b) to g) iteratively.

8. The method of claim 1, wherein optimizing, by the physical design tool, the set of latch clusters by redistributing latches across clusters using cluster geometries includes:

a) converting each latch cluster in the set of latch clusters to a geometric shape;

b) identifying a source latch cluster, the source latch cluster having a smallest latch count among the set of latch clusters;

c) identifying a destination latch cluster, wherein the destination latch cluster is a nearest latch cluster to the source latch cluster that has a latch count that is less than a maximum latch count constraint;

d) determining whether a line drawn between the source latch cluster and the destination latch cluster intersects one or more intervening latch clusters;

e) in response to determining that the line does not intersect an intervening latch cluster, reassigning at least one latch from the source latch cluster to the destination latch cluster;

f) in response to determining that the line intersects one or more intervening latch clusters, reassigning at least one latch from the one or more intervening latch clusters to the destination latch cluster and reassigning at least one latch from the source latch cluster to the one or more intervening latch clusters; and g) repeating steps a) to f) iteratively.

9. The method of claim 8, wherein a number of latches reassigned from the source cluster is equal to a lesser of a latch count of the source latch cluster and a number of available spots in the destination latch cluster.

10. An apparatus for scan chain optimization utilizing constrained single linkage clustering, the apparatus comprising a computer processor, a computer memory operatively coupled to the computer processor, the computer memory having disposed within it computer program instructions that, when executed by the computer processor, cause the apparatus to carry out the steps of:

identifying, by a physical design tool, a placement of a plurality of latches in a circuit layout;

generating, by the physical design tool based on the placement, a set of latch clusters by applying constrained single-linkage agglomerative clustering to the plurality of latches;

optimizing, by the physical design tool, the set of latch clusters by redistributing latches across clusters; and generating, by the physical design tool, a set of scan chains corresponding to the optimized set of latch clusters.

11. The apparatus of claim 10, wherein the clustering enforces one or more of: a maximum latch count constraint for merging clusters; a maximum cluster distance constraint for merging clusters; and a must-link constraint applied to two or more latches.

12. The apparatus of claim 10, wherein the optimizing enforces one or more of: a maximum latch count constraint and a must-link constraint.

13. The apparatus of claim 10, wherein the circuit layout includes a macro, and wherein the macro is weighted with a latch count of the macro.

14. The apparatus of claim 10, wherein generating, by the physical design tool based on the placement, a set of latch clusters by applying constrained single-linkage agglomerative clustering to the plurality of latches includes:

a) initializing the set of latch clusters;

b) determining that a current cluster count is greater than a maximum scan chain count constraint;

c) identifying a pair of latch clusters having a shortest cluster distance;

d) determining that the shortest cluster distance is less than or equal to the maximum cluster distance constraint;

e) determining whether a sum of the latch counts of the pair of clusters is less than or equal to the maximum latch count constraint;

f) merging the pair of latch clusters when the maximum latch count constraint is satisfied;

g) skipping the pair of latch clusters when the maximum latch count constraint is not satisfied; and h) repeating steps b) to g) iteratively.

15. The apparatus of claim 10, wherein optimizing, by the physical design tool, the set of latch clusters by redistributing latches across clusters using cluster geometries includes:

a) converting each latch cluster in the set of latch clusters to a geometric shape;

b) identifying a source latch cluster, the source latch cluster having a smallest latch count among the set of latch clusters;

c) identifying a destination latch cluster, wherein the destination latch cluster is a nearest latch cluster to the source latch cluster that has a latch count that is less than a maximum latch count constraint;

d) determining whether a line drawn between the source latch cluster and the destination latch cluster intersects one or more intervening latch clusters;

e) in response to determining that the line does not intersect an intervening latch cluster, reassigning at least one latch from the source latch cluster to the destination latch cluster;

f) in response to determining that the line intersects one or more intervening latch clusters, reassigning at least one latch from the one or more intervening latch clusters to the destination latch cluster and reassigning at least one latch from the source latch cluster to the one or more intervening latch clusters; and g) repeating steps a) to f) iteratively.

16. A computer program product for scan chain optimization utilizing constrained single linkage clustering, the computer program product disposed upon a computer readable medium, the computer program product comprising computer program instructions that, when executed, cause a computer to carry out the steps of:

identifying, by a physical design tool, a placement of a plurality of latches in a circuit layout;

generating, by the physical design tool based on the placement, a set of latch clusters by applying constrained single-linkage agglomerative clustering to the plurality of latches;

optimizing, by the physical design tool, the set of latch clusters by redistributing latches across clusters; and generating, by the physical design tool, a set of scan chains corresponding to the optimized set of latch clusters.

17. The computer program product of claim 16, wherein the clustering enforces one or more of: a maximum latch count constraint for merging clusters; a maximum cluster distance constraint for merging clusters; and a must-link constraint applied to two or more latches.

18. The computer program product of claim 16, wherein the optimizing enforces one or more of: a maximum latch count constraint, a maximum cluster distance constraint, and a must-link constraint.

19. The computer program product of claim 16, wherein generating, by the physical design tool based on the placement, a set of latch clusters by applying constrained single-linkage agglomerative clustering to the plurality of latches includes:

a) initializing the set of latch clusters;

b) determining that a current cluster count is greater than a maximum scan chain count constraint;

c) identifying a pair of latch clusters having a shortest cluster distance;

d) determining that the shortest cluster distance is less than or equal to the maximum cluster distance constraint;

e) determining whether a sum of the latch counts of the pair of clusters is less than or equal to the maximum latch count constraint;

f) merging the pair of latch clusters when the maximum latch count constraint is satisfied;

g) skipping the pair of latch clusters when the maximum latch count constraint is not satisfied; and h) repeating steps b) to g) iteratively.

20. The computer program product of claim 16, wherein optimizing, by the physical design tool, the set of latch clusters by redistributing latches across clusters using cluster geometries includes:

a) converting each latch cluster in the set of latch clusters to a geometric shape;

b) identifying a source latch cluster, the source latch cluster having a smallest latch count among the set of latch clusters;

c) identifying a destination latch cluster, wherein the destination latch cluster is a nearest latch cluster to the source latch cluster that has a latch count that is less than a maximum latch count constraint;

d) determining whether a line drawn between the source latch cluster and the destination latch cluster intersects one or more intervening latch clusters;

e) in response to determining that the line does not intersect an intervening latch cluster, reassigning at least one latch from the source latch cluster to the destination latch cluster;

f) in response to determining that the line intersects one or more intervening latch clusters, reassigning at least one latch from the one or more intervening latch clusters to the destination latch cluster and reassigning at least one latch from the source latch cluster to the one or more intervening latch clusters; and g) repeating steps a) to f) iteratively.

* * * * *